United States Patent [19]

Nakatani

[11] 4,455,503

[45] Jun. 19, 1984

[54] RECTANGULAR PIEZOELECTRIC RESONATOR WITH A SLOT IN ONE SURFACE

[75] Inventor: Hiroshi Nakatani, Kanazawa, Japan

[73] Assignee: Murata Manufacturing Co., Ltd., Nagaokakyo, Japan

[21] Appl. No.: 512,125

[22] Filed: Jul. 8, 1983

[30] Foreign Application Priority Data

Jul. 9, 1982 [JP] Japan .................... 57-104646[U]

[51] Int. Cl.³ ............................................. H01L 41/08
[52] U.S. Cl. ....................................... 310/368; 310/365
[58] Field of Search .................. 310/366, 365, 368–371

[56] References Cited

U.S. PATENT DOCUMENTS 2,018,246 10/1935 Beard ..................................... 310/368
3,421,109 1/1969 Wiggins et al. .................. 310/367 X
3,543,500 2/1951 Kettering et al. ............... 310/367 X

FOREIGN PATENT DOCUMENTS 832608 4/1960 United Kingdom ................ 310/368

Primary Examiner—Mark O. Budd
Attorney, Agent, or Firm—Wenderoth, Lind & Ponack

[57] ABSTRACT

This disclosure is directed to an improved strip type or rectangular type piezoelectric resonator utilizing length mode vibration, which includes a piezoelectric ceramic substrate, and first and second main electrode faces formed on opposite surfaces of the piezoelectric ceramic substrate, and which is characterized in that there is further provided a groove which is formed in one of said first and second main electrode faces so as to extend over an entire length of the piezoelectric ceramic substrate in a direction parallel to the longitudinal direction thereof. The groove is set to have a depth in the range of 30 to 70% of the thickness of the piezoelectric substrate.

4 Claims, 5 Drawing Figures

RECTANGULAR PIEZOELECTRIC RESONATOR WITH A SLOT IN ONE SURFACE

BACKGROUND OF THE INVENTION

The present invention generally relates to a piezoelectric resonator and more particularly, to an improved strip type or rectangular type piezoelectric resonator for use, for example, in oscillators, electrical filters and the like.

With the recent progress in the field of integrated circuits, inexpensive ceramic resonators have been widely utilized for the actual applications, and normally, disc type or rectangular plate type piezoelectric resonators are generally employed for the purpose in a range of resonance frequencies from 100 KHZ up to 1 MHZ so as to utilize the expansion mode of vibration thereof.

As shown in FIG. 1, the known rectangular plate type piezoelectric resonator referred to above includes, for example, a piezoelectric ceramic substrate 1, main electrode faces 2 and 3 formed on the opposite surfaces of said piezoelectric ceramic substrate 1, and lead wires 4 respectively connected to said main electrode faces 2 and 3. However, in the rectangular plate type piezoelectric resonator as described above or disc type piezoelectric resonator conventionally employed, there have been such disadvantages that they are generally large in size, and moreover, tend to produce spurious waves due to thickness mode vibration based on the fundamental wave.

Meanwhile, as shown in FIG. 2, there has also been conventionally available a strip type piezoelectric resonator utilizing length mode vibration based on the fundamental wave, and having a construction generally similar to that of the rectangular plate type piezoelectric resonator in FIG. 1 as represented by like reference numerals. Although advantageous in that the dimensions are reduced as compared with the rectangular plate type or disc type piezoelectric resonator, the conventional strip type piezoelectric resonator as described above still has disadvantages in that undesirable spurious responses due to width mode vibration and thickness mode vibration tend to be produced.

SUMMARY OF THE INVENTION

Accordingly, an essential object of the present invention is to provide an improved strip type piezoelectric resonator in which undesirable spurious waves due to width mode vibration and thickness mode vibration are suppressed by forming a groove on one of opposite main electrode faces of the resonator, in a direction parallel to the longitudinal direction thereof, with a depth of said groove being set at 30 to 70% of a thickness of said piezoelectric ceramic substrate so as to substantially eliminate the disadvantages inherent in the conventional piezoelectric resonators of this kind.

Another important object of the present invention is to provide a strip type piezoelectric resonator of the above described type, which is simple in construction and stable in functioning at high reliability, and can be readily manufactured on a large scale at low cost.

In accomplishing these and other objects, according to one preferred embodiment of the present invention, there is provided a strip type piezoelectric resonator utilizing lengthwise mode vibration, which includes a piezoelectric ceramic substrate, and first and second main electrode faces formed on opposite surfaces of the piezoelectric ceramic substrate, and is characterized in that there is further provided a groove which is formed in one of said first and second main electrode faces so as to extend over an entire length of the piezoelectric ceramic substrate in a direction parallel to the longitudinal direction thereof. The groove is set to have a depth in the range of 30 to 70% of the thickness of said piezoelectric ceramic substrate.

By the arrangement according to the present invention as described above, an improved strip type piezoelectric resonator with suppressed spurious responses has been advantageously presented through simple construction.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
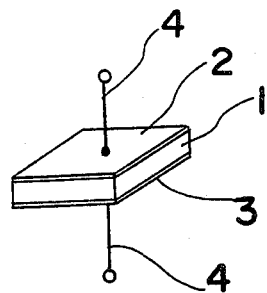
FIG. 1 is a perspective view showing a construction of a conventional rectangular plate type piezoelectric resonator (already referred to)

Before the description of the present invention proceeds, it is to be noted that like parts are designated by like reference numerals throughout the accompanying drawings.

Figure 2:
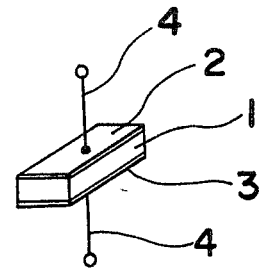
FIG. 2 is a perspective view showing a construction of a conventional strip type piezoelectric resonator (already referred to)
Figure 3:
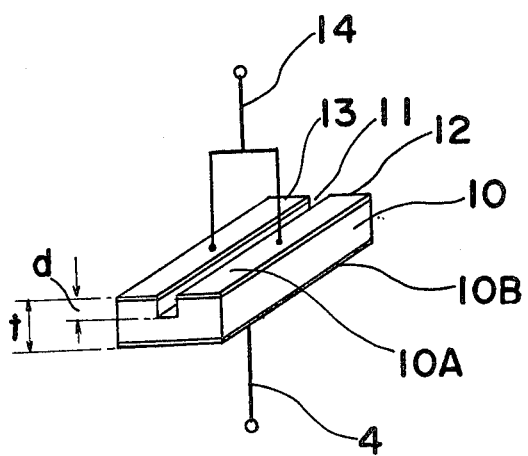
FIG. 3 is a perspective view showing a strip type piezoelectric resonator according to one preferred embodiment of the present invention.

Referring now to the drawings, there is shown in FIG. 3 a strip type piezoelectric resonator according to one preferred embodiment of the present invention, which generally includes a piezoelectric ceramic substrate 10, and upper and lower main electrode faces 10A and 10B formed on opposite surfaces of the substrate 10. In one surface of the piezoelectric ceramic substrate 10 at the side of the upper main electrode face 10A, there is formed a groove 11 which extends over an entire length of the substrate 10 in a direction parallel to the longitudinal direction of said substrate 10, and is located at a center in a widthwise direction of said upper main electrode face 10A or said substrate 10 as illustrated. By the above groove 11, the upper main electrode face 10A of the substrate 10 is divided into one region 12 and the other region 13, while the lower main electrode face 10B is formed on the other entire surface of the substrate 10 in the similar manner as in the conventional arrangement of FIG. 1 or 2.

For the actual use of the piezoelectric resonator of FIG. 3 as described so far, the respective regions 12 and 13 on the upper main electrode face 10A divided by the groove 11 are short-circuited to each other so as to be connected to a lead wire 14 for the upper side, while a lead wire 4 is connected to the lower main electrode face 10B in the similar manner as in the conventional arrangement of FIG. 1 or 2, and thus, a two terminal type resonator is constituted.

More specifically, by way of example, the piezoelectric ceramic substrate 10 is set in dimensions to be 4.65 mm in length, 0.8 mm in width, and 0.3 mm in thickness, and the groove 11 has a width of 0.15 mm and a depth of 0.15 mm, and the oscillation frequency of the strip type piezoelectric resonator of FIG. 3 is 400 KHZ when used as an oscillator.

Figure 4:
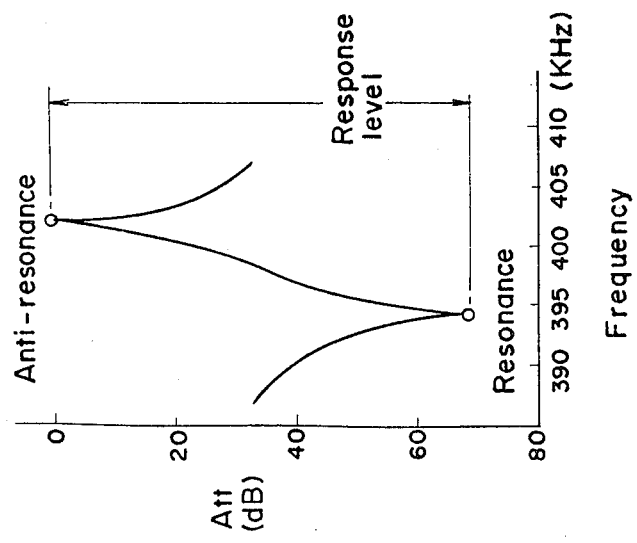
FIG. 4 is a graph showing a state of resonance for the strip type piezoelectric resonator according to the present invention.

Subsequently, in the piezoelectric resonator having the construction as shown in FIG. 3, on the assumption that the depth of the groove 11 is represented by d, and the thickness of the piezoelectric ceramic substrate 10 is denoted by t, measurements were taken on the characteristics thereof, with the value d/t employed as a parameter. As shown in FIG. 4, response level was represented as a level difference between resonant point and anti-resonant point.

Figure 5:
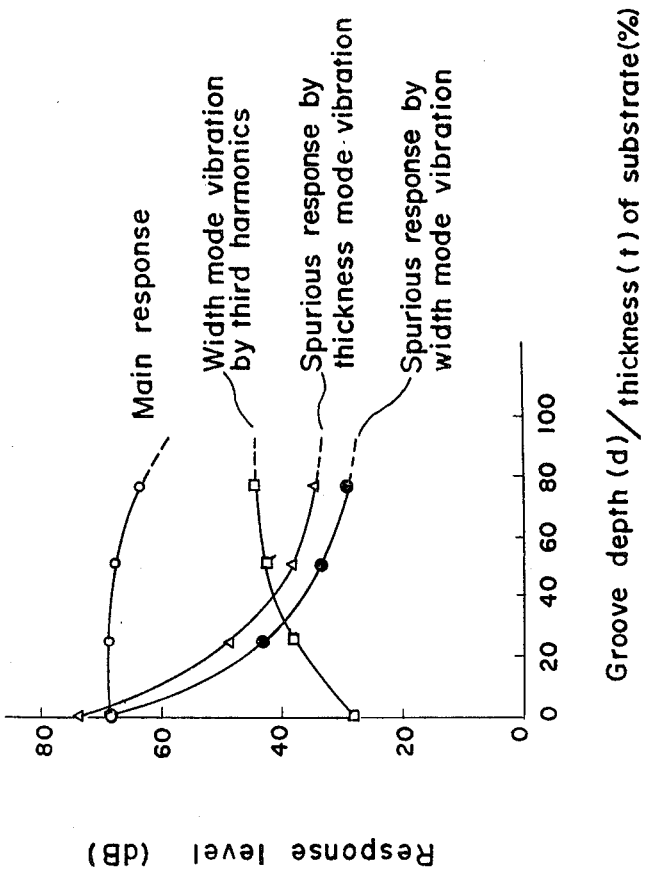
FIG. 5 is a graph showing variations in the characteristics of the strip type piezoelectric resonator according to the present invention when depth of the groove is altered.

As a result of the above measurements, it has been found as shown in FIG. 5 that, as the value d/t increases, the main response gradually decreases, whereas the spurious responses due to thickness mode vibration and width mode vibration based on the fundamental wave, which were approximately the same magnitude as that of the main response in the absence of the groove 11, are rapidly reduced with the increase of the value of d/t. Moreover, width mode vibration by third harmonics (first excited overtone of width mode) is gradually increased, following the increase of the value d/t.

Normally, for the spurious oscillation to be suppressed, it is necessary that the spurious waves are reduced to less than half of the main response, and in order to satisfy the above requirement in the result of measurement in FIG. 5, d/t must be larger than 30%. On the other hand, since the strength of the piezoelectric ceramic substrate 10 tends to be reduced due to the increase of d/t, with a simultaneous reduction of the main response, the upper limit of d/t is at 70%.

Accordingly, as is seen from the above description, the depth of the groove 11 to be provided according to the present invention should be in the range of 30 to 70% of the thickness of the piezoelectric ceramic substrate.

In the arrangement of FIG. 3, although the groove 11 is provided in the upper main electrode face 10A, it is needless to say that such groove 11 may be so modified as to be provided in the lower main electrode face 10B to obtain the same effect.

Furthermore, in the foregoing embodiment, although the groove 11 is described as formed at the center in the widthwise direction of the upper main electrode surface 10A, results of measurements generally in the similar trend as those of FIG. 5 have been obtained even when said groove 11 is deviated in position to either one side of said electrode surface 10A.

It should be noted here that, although the arrangement of the present invention is prepared as a resonator, it is best suited to applications to an oscillator.

For manufacturing the strip type piezoelectric resonator according to the present invention in an efficient manner, processings may be effected in such steps as forming electrode layers over the entire opposite surfaces, i.e. upper and lower surfaces of a large piezoelectric ceramic plate having a predetermined thickness, subsequently forming grooves each having the predetermined depth in one of the electrode formed surfaces at equal intervals, and finally cutting off the large piezoelectric ceramic plate thus processed into dimensions of individual piezoelectric resonators as shown in FIG. 3.

As is clear from the foregoing description, according to the present invention, since the piezoelectric resonator is constituted by forming the groove having the depth at 30 to 70% of the thickness of the strip type piezoelectric ceramic substrate in one of the main electrode faces of the strip type piezoelectric ceramic substrate in a direction parallel to the longitudinal direction thereof, spurious waves due to width mode vibration and thickness mode vibration may be suppressed to less than 40 dB with respect to the main response of 65 dB, and thus, the piezoelectric resonator free from generation of spurious response has been advantageously presented.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A strip type piezoelectric resonator utilizing length mode vibration, which comprises a piezoelectric ceramic substrate, and first and second main electrode faces formed on opposite surfaces of the piezoelectric ceramic substrate, the improvement comprising a groove which is formed on one of said first and second main electrode faces so as to extend over an entire length of the piezoelectric ceramic substrate in a direction parallel to the longitudinal direction thereof, said groove being set to have a depth in the range of 30 to 70% of the thickness of said piezoelectric ceramic substrate.

2. A strip type piezoelectric resonator as claimed in claim 1, wherein said groove is formed at a center in a widthwise direction of the piezoelectric ceramic substrate to divide the one of said first and second main electrode faces into two regions.

3. A strip type piezoelectric resonator as claimed in claim 1, wherein said piezoelectric ceramic substrate is set to be 4.65 mm in length, 0.8 mm in width and 0.3 mm in thickness, and said groove is set to be 0.15 mm in width and 0.15 mm in depth, said piezoelectric resonator having a frequency at 400 KHZ when used as an oscillator.

4. A process of manufacturing a strip type piezoelectric resonator utilizing length mode vibration, which comprises a piezoelectric ceramic substrate, and first and second main electrode faces formed on opposite surfaces of the piezoelectric ceramic substrate, and is characterized in that there is further provided a groove which is formed on one of said first and second main electrode faces so as to extend over an entire length of the piezoelectric ceramic substrate in a direction parallel to the longitudinal direction thereof, said groove being set to have a depth in the range of 30 to 70% of the thickness of said piezoelectric substrate, said process comprising the steps of forming electrode layers for said first and second main electrode faces over entire opposite surfaces of a large area piezoelectric ceramic plate having a predetermined thickness, subsequently forming groove rows each having predetermined depth for said groove in one of said electrode layers at equal intervals, and finally cutting off said large area piezoelectric ceramic substrate thus processed into the dimensions of said individual strip type piezoelectric resonators.

* * * * *